US007144772B2

(12) United States Patent
Lee et al.

(10) Patent No.: US 7,144,772 B2
(45) Date of Patent: Dec. 5, 2006

(54) SEMICONDUCTOR DEVICES HAVING CAPACITORS OF METAL-INSULATOR-METAL STRUCTURE WITH COEXTENSIVE OXIDATION BARRIER PATTERN AND LOWER ELECTRODE BOTTOM AND METHODS OF FORMING THE SAME

(75) Inventors: Sung-Yung Lee, Seoul (KR); Nak-Won Jang, Seoul (KR); Heung-Jin Joo, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 96 days.

(21) Appl. No.: 10/650,344

(22) Filed: Aug. 28, 2003

(65) Prior Publication Data

US 2004/0108536 A1 Jun. 10, 2004

(30) Foreign Application Priority Data

Oct. 30, 2002 (KR) ...................... 10-2002-0066520

(51) Int. Cl.
*H01L 21/8242* (2006.01)

(52) U.S. Cl. ...................... 438/244; 438/142; 438/197; 438/238; 438/239; 438/243; 257/E21.396; 257/301; 257/303

(58) Field of Classification Search ................ 257/296, 257/297, 298, 299, 300, 301, 302, 303, 304, 257/305, 307, 308, 309, 310, 311, 312; 438/244, 438/253, 287, 396
See application file for complete search history.

(56) References Cited

U.S. PATENT DOCUMENTS 5,459,345 A * 10/1995 Okudaira et al.
5,563,762 A * 10/1996 Leung et al.
5,959,319 A * 9/1999 Iwasa
6,001,682 A * 12/1999 Chien
6,090,697 A * 7/2000 Xing et al.
6,118,144 A * 9/2000 Kimura
6,353,269 B1 * 3/2002 Huang
6,452,229 B1 * 9/2002 Krivokapic
6,458,284 B1 * 10/2002 Kashihara
2001/0006245 A1 * 7/2001 Yunogami et al.
2002/0008724 A1 * 1/2002 Kubota et al.

FOREIGN PATENT DOCUMENTS

KR 2002-0002599 1/2002

* cited by examiner

*Primary Examiner*—Nathan J. Flynn
*Assistant Examiner*—Kevin Quinto
(74) *Attorney, Agent, or Firm*—Myers Bigel Sibley & Sajovec PA

(57) ABSTRACT

A semiconductor device having MIM capacitors is configured so that the bottom surface of the lower electrode and a top surface area of an oxidation barrier pattern are substantially equal. Related methods for forming the device are also described.

17 Claims, 5 Drawing Sheets

SEMICONDUCTOR DEVICES HAVING CAPACITORS OF METAL-INSULATOR-METAL STRUCTURE WITH COEXTENSIVE OXIDATION BARRIER PATTERN AND LOWER ELECTRODE BOTTOM AND METHODS OF FORMING THE SAME

RELATED APPLICATION

This application claims priority to Korean Patent Application 2002-66520, filed on Oct. 30, 2002, the content of which is incorporated by reference herein in its entirety.

FIELD OF THE INVENTION

The present invention relates to a semiconductor device and a method of forming the same. More particularly, the present invention is directed to a semiconductor device having capacitors of a metal-insulator-metal structure and a method of forming the same.

BACKGROUND OF THE INVENTION

A typical capacitor includes a lower electrode, an upper electrode and a dielectric film interposed therebetween. Since the capacitor accumulates charges, it has been used for data storage in semiconductor memory devices. One type of semiconductor memory device is DRAM ("dynamic random access memory") which can form a unit cell having one transistor for inputting/outputting data and one capacitor for storing the data.

Unfortunately, with present trends toward high integration of semiconductor devices, the capacitance of semiconductor capacitors may continue to decrease. One technique which has been proposed to solve this problem is to use a dielectric film of a capacitor that has a higher dielectric value than oxide-nitride-oxide (ONO). However, the dielectric film can undesirably react on the lower electrode to deteriorate a capacitor characteristic (e.g., leakage current). In order to overcome the potential deterioration of the capacitor characteristic, a capacitor having a metal-insulator-metal (MIM) structure (hereinafter referred to as "MIM capacitor") has been proposed. The MIM capacitor includes a lower electrode, an upper electrode, and a metal layer (particularly, noble metal layer) to reduce the capacitor leakage current. Further, the MIM capacitor may constitute the unit cell of a ferroelectric memory device. Similar to a DRAM unit cell, the unit cell of the ferroelectric memory includes one transistor and one capacitor. A difference therebetween is that the capacitor of the ferroelectric memory device has a dielectric film made of ferroelectric. Since the ferroelectric film has a polarization hysteresis characteristic, a capacitor using the ferroelectric film can retain its stored data even when its power supply is interrupted.

When fabricating a semiconductor device having the MIM capacitor, an oxidation barrier pattern is conventionally formed between a lower electrode and an underlying contact plug. During an annealing process for crystallizing a high-k dielectric film or a ferroelectric film, the lower electrode or the contact plug may be oxidized to increase contact resistance. The oxidation barrier pattern can reduce the increase of the annealing-induced contact resistance.

A first conventional method for forming a lower electrode of a conventional MIM capacitor is described below with reference to FIG. 1 and FIG. 2. Another conventional method for forming a lower electrode and an oxidation barrier pattern of a conventional MIM capacitor is described below with reference to FIG. 3.

Referring to FIG. 1 and FIG. 2, a lower interlayer dielectric 2 is formed on a semiconductor substrate 1. Buried contact plugs 3 are formed through the lower interlayer dielectric 2 to connect to a predetermined region of the semiconductor substrate 1. An oxidation barrier pattern 4 is formed over a top surface of the buried contact plug 3. An upper interlayer dielectric 5 is formed on an entire surface of a semiconductor substrate including the oxidation barrier pattern 4. The upper interlayer dielectric 5 is patterned to form a lower electrode recess 6 exposing a predetermined region of the oxidation barrier pattern 4. A lower electrode layer 7 is formed on an entire surface of the semiconductor substrate 1 including an inside of the lower electrode recess 6. A sacrificial insulating layer 8 is formed on the lower electrode layer 7 to fill the lower electrode recess 6. The lower electrode layer 7 is made of metal. As shown in FIG. 2, the sacrificial insulating layer 8 and the lower electrode layer 7 are planarized down to a top surface of the upper interlayer dielectric 5 to form a lower electrode 7*a* and a sacrificial insulating pattern 8*a* which are sequentially stacked in the lower electrode recess 6.

In view of a design constraint, the oxidation barrier pattern 4 is minimally spaced apart from an adjacent oxidation barrier pattern 4. The lower electrode recess 6 may not entirely expose the top surface of the oxidation barrier pattern 4 because of an alignment margin 10 between the lower electrode recess 6 and the oxidation barrier pattern 4. That is, the top surface of the oxidation barrier pattern 4 has an area which is obtained by adding an area corresponding to the bottom surface of the lower electrode 7*a* to the area corresponding to the alignment margin(s) 10 of the oxidation barrier pattern 4. Accordingly, the surface area of the lower electrode 7*a* may be smaller than that of a lower electrode formed without the oxidation barrier pattern 4.

Referring to FIG. 3, the buried contact plug 3 is formed through the lower interlayer dielectric 2 to the semiconductor substrate 1. The buried contact plug 3 is connected to a predetermined region of the semiconductor substrate 1. The upper interlayer dielectric 5 is formed on an entire surface of a semiconductor substrate 1 including the buried contact plug 3. The upper interlayer dielectric layer 5 is patterned to form a lower electrode recess 6 exposing a top surface of the interlayer dielectric 5. An oxidation barrier layer (not shown) and a lower electrode layer (not shown) are sequentially formed on an entire surface of a semiconductor substrate 1 including an inside of the lower electrode recess 6. A sacrificial insulating layer (not shown) is formed on the lower electrode layer to fill the lower electrode recess 6. The sacrificial insulating layer, the lower electrode layer, and the oxidation barrier layer are sequentially planarized down to a top surface of the interlayer dielectric 5 to form an oxidation barrier pattern 4*a*, the lower electrode 7*a*, and a sacrificial insulating pattern 8*a* which are sequentially stacked in the lower electrode recess 6.

The oxidation barrier pattern 4*a* is also formed on a bottom side and sidewalls of the lower electrode 7*a*. In this case, a surface area of the lower electrode 7*a* is smaller than that of a lower electrode without the oxidation barrier pattern 4*b*. This is because the oxidation barrier layer 4*a* is formed on the sidewalls of the lower electrode 7*a* to thereby reduce the size of the lower electrode 7*a*.

SUMMARY OF THE INVENTION

In certain embodiments, the present invention provides semiconductor devices that include an interlayer dielectric formed on a semiconductor substrate. A buried contact plug is disposed through the interlayer dielectric to be connected to a predetermined region of the semiconductor substrate. An oxidation barrier pattern is disposed on a top surface of the buried contact plug. A portion of a lower electrode is disposed on the oxidation barrier pattern. A top surface area of the oxidation barrier pattern is substantially equal to a bottom surface area of the lower electrode.

In particular embodiments, an external sidewall of the lower electrode and a sidewall of the oxidation barrier pattern are disposed in a beeline (i.e., in a substantially straight line). An upper electrode can be disposed over the lower electrode with a dielectric film therebetween. The dielectric film may be made of a high-k (dielectric coefficient) value dielectric substance that has a higher dielectric constant value than oxide-nitride-oxide (ONO). The dielectric film may be made of a ferroelectric material.

Other embodiments are directed to a method of fabricating a semiconductor device. The method includes forming an oxidation barrier pattern and a capping layer pattern which are sequentially stacked on a semiconductor substrate. A mold insulating layer having an etch selectivity with respect to the capping layer pattern is formed on a semiconductor substrate including the capping layer pattern. The mold insulating layer can be removed and/or planarized down to a top surface of the capping layer pattern. The exposed capping layer pattern is etched to form a lower electrode recess exposing an entire top surface of the oxidation barrier pattern to form a lower electrode in the lower electrode recess. In this case, the capping layer pattern is made of a material having an etch selectivity with respect to the oxidation barrier pattern.

In certain embodiments, the capping layer pattern can be made of silicon nitride. Following formation of the lower electrode, the method can further include etching the mold insulating layer to be removed and sequentially stacking a dielectric film and an upper electrode on the lower electrode. The dielectric film may be made of a dielectric substance having a higher dielectric constant than oxide-nitride-oxide (ONO). The dielectric film may be made of a ferroelectric material.

Certain embodiments are directed to a MIM capacitor including: (a) semiconductor substrate; (b) an oxidation barrier pattern residing above and in electrical communication with the semiconductor substrate, wherein the oxidation barrier pattern defines a lower electrode platform with a top surface; (c) a lower electrode having a bottom and at least one sidewall, the bottom being disposed on the oxidation barrier pattern lower electrode platform; (d) an upper electrode in spaced apart alignment with the lower electrode; and (e) a dielectric layer interposed between the upper and lower electrodes. The lower electrode bottom has a surface area that is substantially coextensive with the surface area of the top surface of the oxidation barrier pattern lower electrode platform.

Additional embodiments are directed toward a semiconductor device having a plurality of capacitors of a metal-insulator-metal structure. The capacitors each include upper electrodes, lower electrodes and a dielectric layer interposed therebetween. The capacitors reside above a semiconductor substrate with each capacitor having a corresponding oxidation barrier pattern in electrical communication with respective regions of the semiconductor substrate. The device is configured so that the lower electrodes have a bottom surface area that is substantially equal to the surface area of the upper surface of the underlying oxidation barrier pattern.

In certain embodiments, the lower electrode is substantially cylindrical with a closed continuous surface bottom. The device may be suitable to define a portion of an integrated circuit, such as the unit cell of a DRAM memory device and/or a unit cell of a ferroelectric memory device.

Other embodiments are directed to methods for fabricating a semiconductor device with a plurality of MIM capacitors in unit cells of an integrated circuit memory device. The method includes forming an oxidation barrier pattern on a semiconductor substrate; and forming a lower electrode disposed on the oxidation barrier pattern so that a top surface area of the oxidation barrier pattern is substantially equal to a bottom surface area of the lower electrode.

In particular embodiments, the lower electrode forming step may include: (a) forming a layer on the oxidation barrier pattern, the layer having a recess with a bottom that is sized to be substantially coextensive with a top surface of the oxidation barrier pattern; and (b) applying a conductive layer in the recess to thereby form the lower electrode.

DETAILED DESCRIPTION

Figure 1:
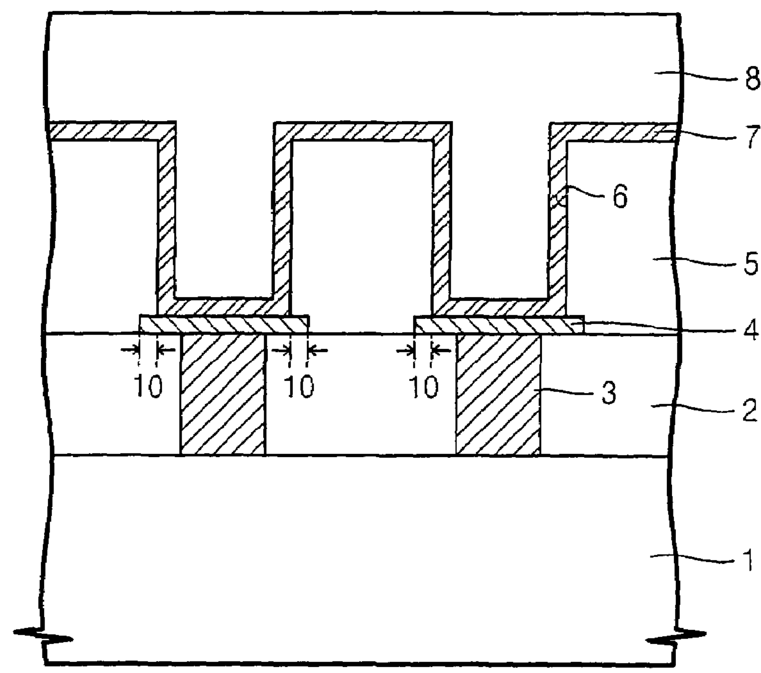
FIG. 1 and FIG. 2 are cross-sectional views of a MIM capacitor for explaining a prior art method for forming a lower electrode of a conventional MIM capacitor.
Figure 2:
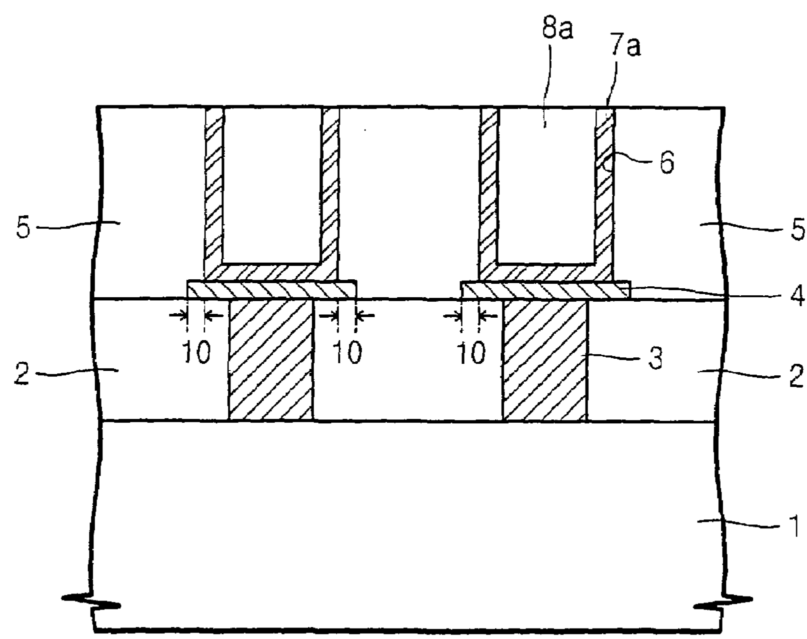
Figure 3:
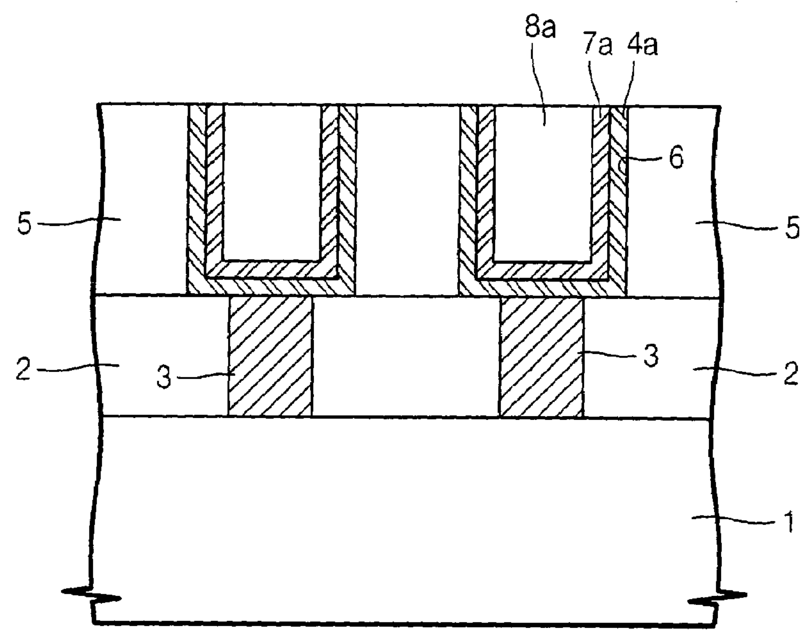
FIG. 3 is a cross-sectional view of a MIM capacitor for explaining another prior art method for forming a lower electrode of a conventional MIM capacitor.

The present invention will now be described more fully hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. It will also be understood that when a layer is referred to as being “on” another layer or substrate, it can be directly on the other layer or substrate, or intervening layers, films, coatings and the like may also be present unless the word “directly” is used which indicates that the feature or layer directly contacts the feature or layer. Like numbers refer to like elements throughout. In addition, spatially relative terms, such as “beneath”, “below”, “lower”, “above”, “upper” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” other elements or features would then be oriented “above” the other elements or features. Thus, the exemplary term “below” can encompass both an orientation of above and below. The device may be otherwise oriented (rotated 90 degrees or at other orientations) and the spatially relative descriptors used herein interpreted accordingly.

A semiconductor device including a MIM capacitor 100 according to embodiments of the present invention is now described below with reference to FIG. 4.

Figure 4:
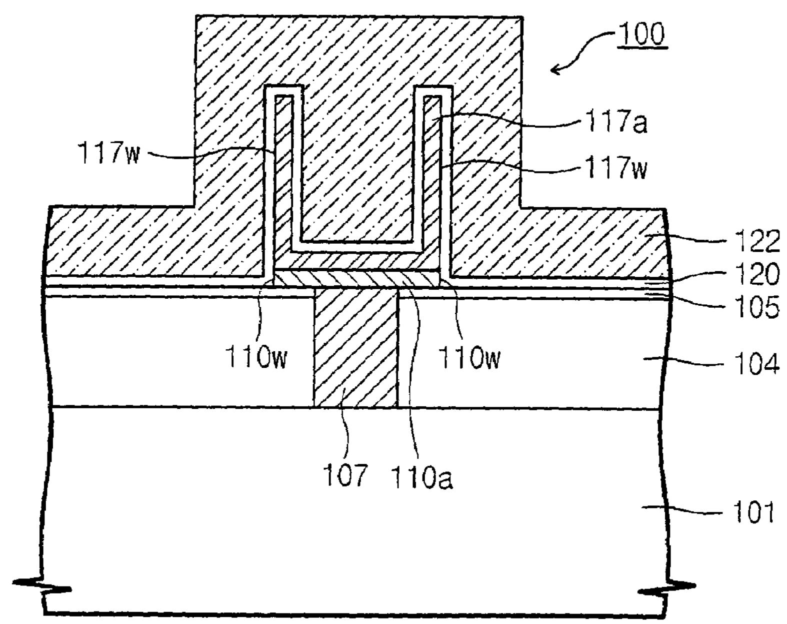
FIG. 4 is a cross-sectional view of a semiconductor device which includes a MIM capacitor according to embodiments of the present invention.

Referring to FIG. 4, first (shown as a lower) interlayer dielectric 104 and an etch-stop layer 105 are sequentially stacked on a semiconductor substrate 101. A buried contact plug 107 extends through the etch-stop layer 105, where used, and the first interlayer dielectric 104 to be electrically connected to a predetermined region of the semiconductor substrate 101. The term "buried" means that the body of the contact plug extends at least partially a distance into the interlayer dielectric so as to provide at least a portion of an electrical path between the semiconductor substrate 101 and the lower electrode 117*a*. The etch-stop layer 105 is optional. The first interlayer dielectric 104 may be made of silicon oxide. The buried contact plug 107 may be made of a conductive material such as, for example, doped polysilicon or tungsten (W). The etch-stop layer 105 may be made of an insulating material (e.g., silicon nitride) having an etch selectivity with respect to the first interlayer dielectric 104. The term "etch selectivity" means that the material or layer is resistant to removal during exposure to an etch removal process (i.e., less sensitive or susceptible than the target etch-removable material or layer so that the non-target material or layer remains substantially intact relative to the target material or layer).

Still referring to FIG. 4, an oxidation barrier pattern 110*a* is disposed on the top or upper surface of the buried contact plug 107. A lower electrode 117*a* is configured so that a bottom portion thereof is disposed on the upper surface of the oxidation barrier pattern 110*a*. A predetermined region of a bottom side of the oxidation barrier pattern 110*a* is electrically connected to the top surface of the buried contact plug 107. The top surface area of the oxidation barrier pattern 110*a* is substantially equal to a bottom surface area of the lower electrode 117*a*. Namely, the top surface of the oxidation barrier pattern 110*a* contacts substantially an entire bottom of (i.e., is substantially coextensive with) the lower electrode 117*a* and the oxidation barrier pattern 110*a* and the lower electrode 117*a* are electrically connected to each other. In certain embodiments, the lower electrode 117*a* may be configured as a cylindrical electrode.

In certain embodiments, as shown in FIG. 4, an external sidewall 117*w* of the lower electrode 117*a* and a sidewall 110*w* of the corresponding oxidation barrier pattern 110*a* are spatially aligned so that the outer perimeters thereof are disposed in a beeline or substantially straight line. Stated differently, in particular embodiments, the bottom outermost opposing sides of a respective lower electrode 117*a* of a MIM capacitor terminate into the corresponding underlying sidewalls of the corresponding oxidation barrier pattern 110*a* so as to jointly define an outermost perimeter profile with two spaced apart substantially vertical lines when viewed in cross-section. Accordingly, the lower electrode 117*a* may have larger area than a conventional lower electrode. As a result, the capacitor having the lower electrode 117*a* may have a higher capacitance than a capacitor having the conventional lower electrode.

In certain embodiments, the oxidation barrier pattern 110*a* comprises a material resistant to an oxidation process, e.g., conductive metal nitride such as TiN, TaN, TiAIN, WN, and so forth. The lower electrode 117*a* may comprise a suitable conductive material, such as, for example, noble metals and/or conductive compounds containing noble materials. The noble metals include, for example, palladium (Pd), ruthenium (Ru), platinum (Pt), and iridium (Ir). An exemplary conductive compound containing a noble metal is iridium dioxide ($IrO_2$).

Still referring to FIG. 4, an upper electrode 122 is disposed over the lower electrode 117*a* with a dielectric film 120 interposed therebetween. The capacitor 100 comprises the lower electrode 117*a*, the dielectric film 120, and the upper electrode 122.

In certain embodiments, the upper electrode 122 can comprise a suitable conductive material(s) such as noble metals and/or conductive compounds containing the noble metals. The noble metals include, for example, palladium (Pd), ruthenium (Ru), platinum (Pt), and iridium (Ir). An exemplary conductive compound containing a noble metal is iridium dioxide ($IrO_2$).

The dielectric film 120 may comprise a high dielectric constant ("high-k") dielectric material or substance having a higher dielectric constant that is greater than that of ONO (oxide-nitride-oxide). In certain embodiments, the dielectric film 120 is made of, for example, aluminum oxide ($Al_2O_3$) or hafnium oxide ($HfO_2$). In certain embodiments, the capacitor 100, typically having the high-k dielectric film 120, can be used as a capacitor constituting a unit cell of a DRAM memory device. Unlike conventional unit cell capacitors of a DRAM device, the dielectric film 120 can comprise a ferroelectric substance such as PZT, SBT, BLT or combinations thereof. In particular embodiments, the capacitor 100 which may have the ferroelectric dielectric film 120, is used as a capacitor constituting a unit cell of a ferroelectric memory device. As such, the unit memory cell may include a transistor in communication with the capacitor.

A method of fabricating a semiconductor device including a MIM capacitor according to embodiments of the present invention is now described below with reference to FIG. 5 through FIG. 10.

Figure 5:
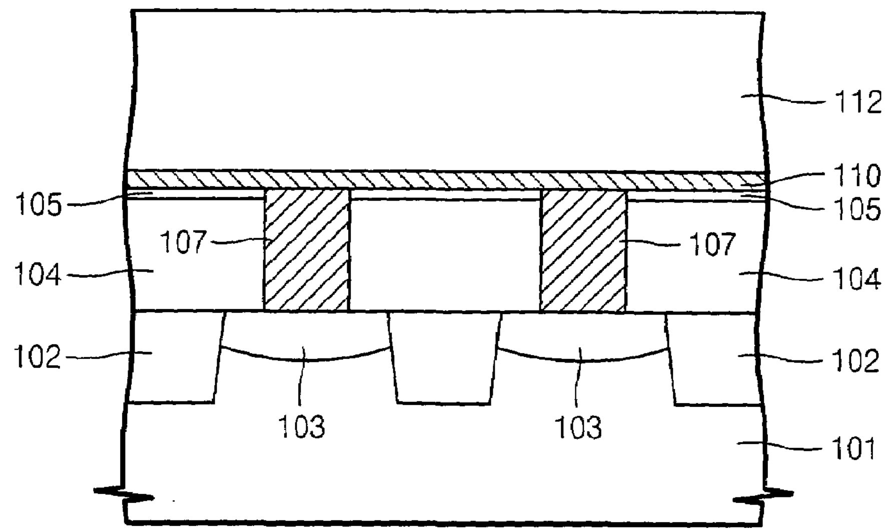
FIG. 5 through FIG. 10 are cross-sectional views of a semiconductor device which includes features of and/or used in forming MIM capacitor according to embodiments of the present invention.

Referring to FIG. 5, a device isolation layer 102 is formed at a semiconductor device to define an active region. The device isolation layer 102 may be a trench isolation layer. Impurities are selectively implanted into the active region to form an impurity diffusion layer 103. The impurity diffusion layer 103 may be a source/drain region of a transistor (not shown). The first interlayer dielectric 104 and the (optional) etch-stop layer 105 are sequentially stacked on the impurity diffusion layer 103. In certain embodiments, the first interlayer dielectric 104 may comprise silicon oxide, and, as discussed above, where used, the etch-stop layer 105 may be made of an insulating material having an etch selectivity with respect to silicon oxide, e.g., silicon nitride. The buried contact plug 107 is formed through the etch-stop layer 105 and the first interlayer dielectric 104 to be connected to a predetermined region of the impurity diffusion layer 103. The buried contact plug 107 may comprise a conductive material such as, for example, doped polysilicon or tungsten (W). An oxidation barrier layer 110 and a capping layer 112 are sequentially stacked over the surface of the semiconductor substrate 101 including over the buried contact plug 107. The oxidation barrier layer 110 can comprise a conductive material which is strongly resistant to oxidation, e.g., conductive metal nitride such as TiN, TaN, TiAIN, and/or WN. The capping layer 112 may be made of a material having an etch selectivity with respect to the oxidation barrier layer 110, e.g., silicon nitride.

Figure 6:
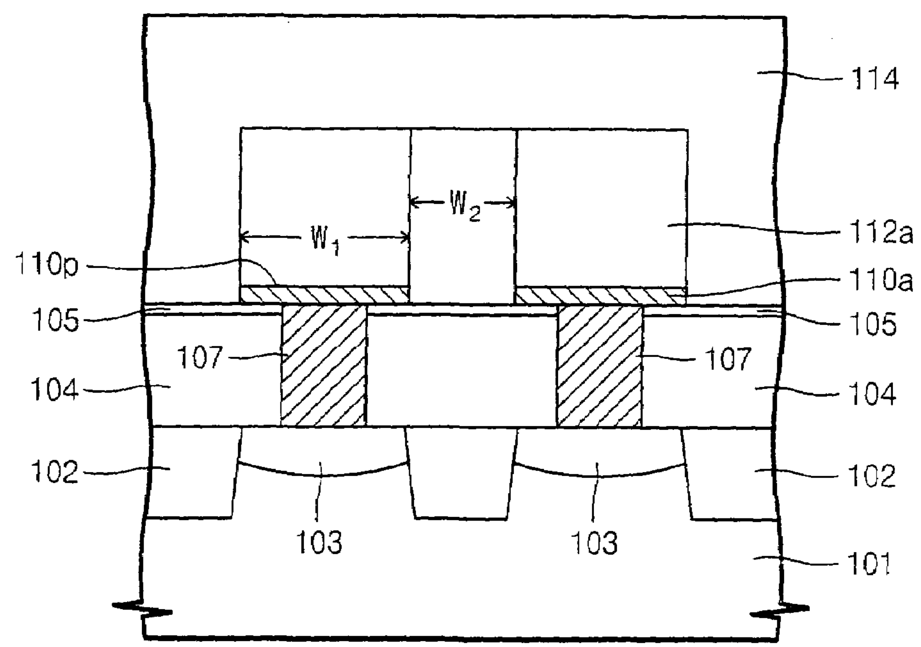
Figure 7:
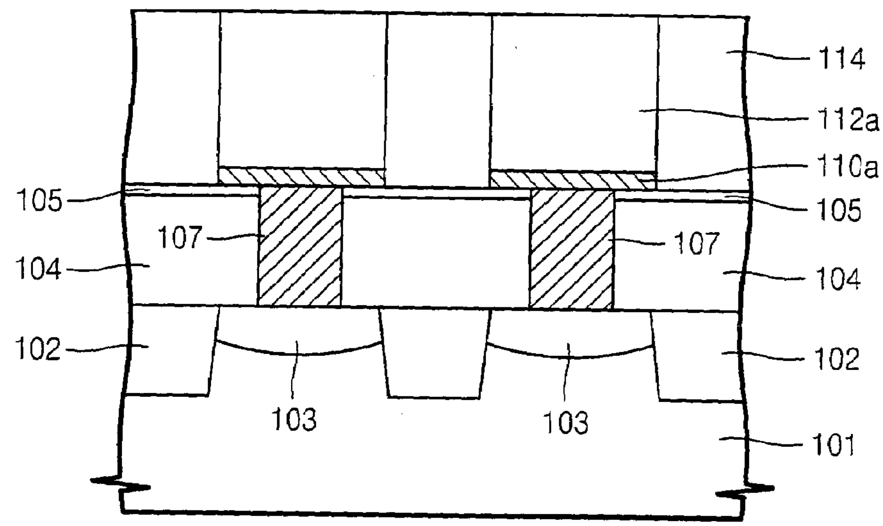

Referring to FIG. 6 and FIG. 7, the capping layer 112 and the oxidation barrier layer 110 can be successively patterned to form a respective oxidation barrier layer pattern 110*a* and a capping layer pattern 112*a* which are, as described above, sequentially stacked. The oxidation barrier layer pattern 110*a* covers a top surface of the buried contact plug 107, i.e., is electrically connected to the buried contact plug 107. In view of the design constraint, the oxidation barrier layer pattern 110*a* may be formed to provide a plurality of proximately positioned lower electrode platforms 110*p*, each having a width "$W_1$" that can be substantially the same width as the bottom of the lower electrode 117*a* (FIG. 4). Adjacent ones of the oxidation barrier layers 110*a* can be minimally spaced apart from each other. The spacing may be such that a distance "$W_2$" separates adjacent barrier layer patterns 110*a*.

A mold insulating layer 114 is formed over the surface of the stacked semiconductor substrate 101 including the capping layer pattern 112*a* and the oxidation barrier layer pattern 110*a*. The mold insulating layer 114 can be made of an insulating material having an etch selectivity with respect to the material forming the capping layer pattern 112*a*. In addition, the mold insulating layer 114 can have an etch selectivity with respect to the material forming the oxidation barrier layer pattern 110*a* and the material forming the etch-stop layer 105. The mold insulating layer 114 may be made of, for example, silicon oxide.

By means of a suitable material removal process, such as, but not limited to, an etch-back or chemical mechanical polishing (CMP) technique, the mold insulating layer 114 can be planarized down to a top surface of the capping layer pattern 112*a* as shown in FIG. 7.

Figure 8:
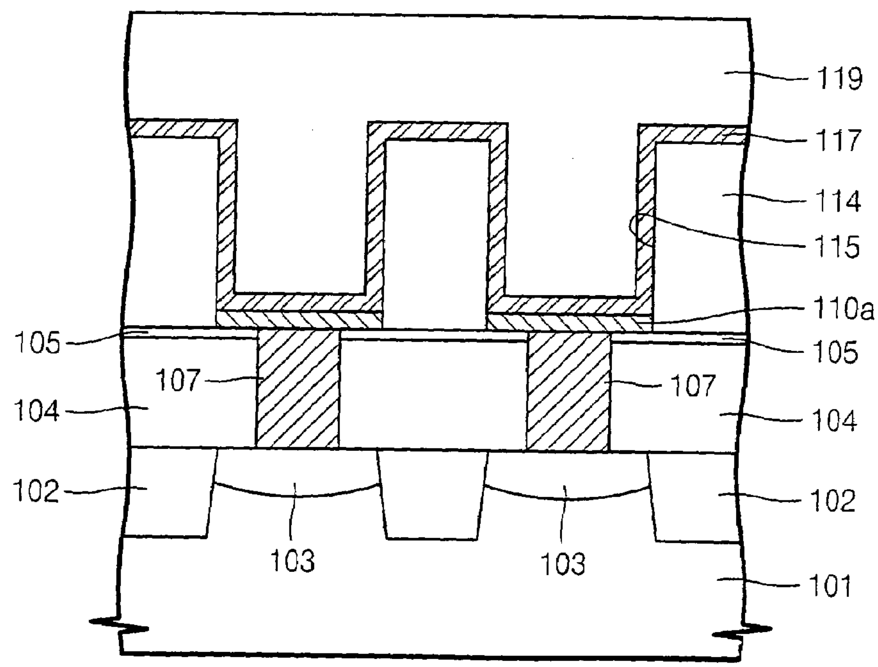
Figure 9:
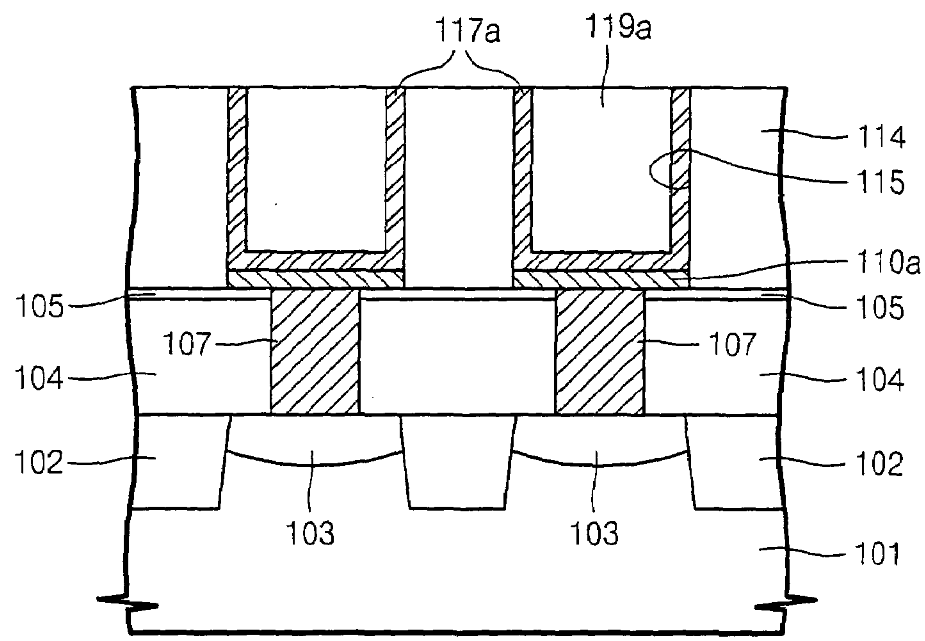

Referring to FIG. 8 and FIG. 9, the exposed capping layer pattern 112*a* is removed and/or etched down to a top surface of the oxidation barrier layer pattern 110*a*. As a result, the exposed capping layer pattern 112*a* is removed to form a selfaligned lower electrode recess 115. By removing the capping layer pattern 112*a*, a void region corresponding to where the capping layer pattern 112*a* was disposed becomes the lower electrode recess 115. A sidewall 115*w* of the lower electrode recess 115 is formed by the adjacent portion of the mold insulating layer 114, and the lower electrode recess 115 can expose the entire top surface (the lower electrode platform 110*p*) of the oxidation barrier layer pattern 110*a*.

Referring to FIG. 8, a lower electrode layer 117 is conformably formed over the exposed portions of the stacked layers residing on the semiconductor substrate 101 including over the top, bottom and sidewalls of the lower electrode recess 115. A sacrificial insulating layer 119 is formed over the lower electrode layer 117 in an amount sufficient to fill the lower electrode recess 115. In certain embodiments, the lower electrode layer 117 comprises a conductive material such as noble metals and conductive compounds containing the noble metals. As described above, the noble metals include, for example, palladium (Pd), ruthenium (Ru), platinum (Pt), and iridium (Ir). One exemplary conductive compound containing a noble metal is iridium dioxide ($IrO_2$). The sacrificial insulating layer 119 may comprise silicon nitride.

Referring to FIG. 9, the sacrificial insulating layer 119 and the lower electrode layer 117 are planarized down to a top surface of the mold insulating layer 114 to form the lower electrode 117*a* and a sacrificial insulating layer pattern 119*a*. The insulating layer 119 resides over the lower electrode layer 117 (i.e., they are sequentially stacked) in the lower electrode recess 115. Due to the configuration of the lower electrode recess 115, a bottom side of the lower electrode 117*a* contacts substantially the entire top surface of a corresponding oxidation barrier pattern 110*a*. That is, the bottom surface area of the lower electrode 117*a* is substantially equal to a top surface area of the oxidation barrier layer pattern 110*a*. Thus, the lower electrode 117*a* can have an increased area than a conventional lower electrode. As a result, a capacitance of the capacitor having the lower electrode 117*a* configured in this manner can increase.

Figure 10:
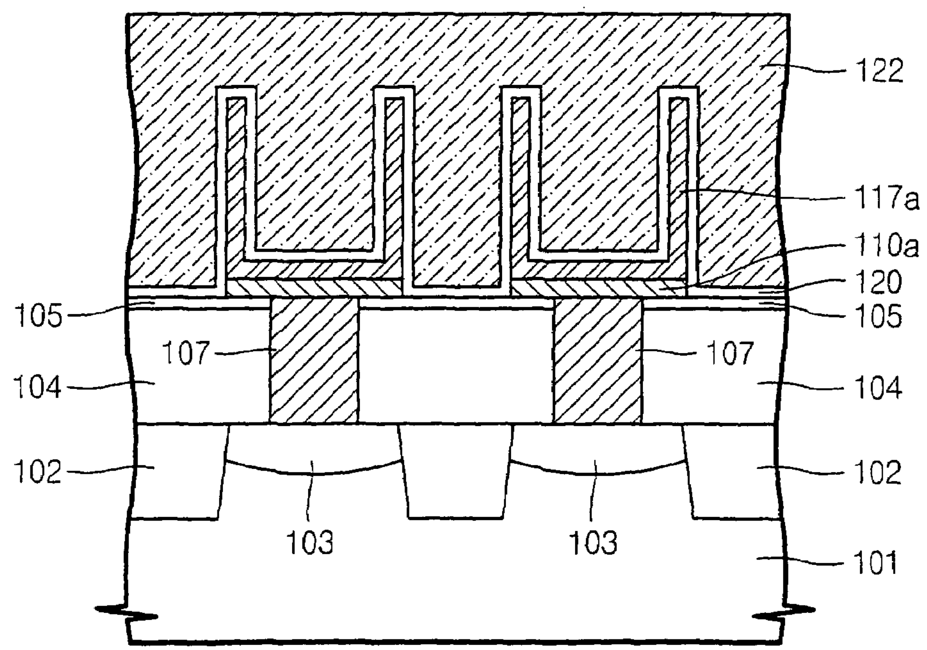

Referring to FIG. 10, the sacrificial insulating layer pattern 119*a* and the planarized mold insulating layer 114 can be removed, typically etched, to expose the electrode layer 117 and the etch-stop layer 105. The etch removal can be carried out with any suitable etch removal process, and in certain embodiments is an isotropic etch that may be conducted by, for example, a wet etch. After this operation(s), inside and external surfaces of the sidewall(s) and the inner surface of the bottom or floor of the lower electrode 117*a* are exposed.

A dielectric film 120 can then be conformably formed over the exposed surface (typically the entire surface) of the stacked configuration overlying and/or the semiconductor substrate 101 where the etch-stop layer 105 is exposed. The upper electrode 122 is formed on and/or over the dielectric film 120 above the lower electrode 117*a*. The capacitor 100 includes the lower electrode 117*a*, the dielectric film 120, and the upper electrode 122.

As described above, the dielectric film 120 may comprise a high-k dielectric material that has a higher dielectric constant than ONO (oxide-nitride-oxide). For example, the high-k dielectric material can be aluminum oxide ($Al_2O_3$) and/or hafnium oxide ($HfO_2$). As also described above, in certain embodiments, a capacitor having the high-k dielectric film may be used as a capacitor constituting a unit cell of a DRAM memory device. Unlike prior unit cells of DRAM memory devices, the dielectric film 120 may be made of and/or comprise a ferroelectric material such as PZT, SBT, BLT or combinations thereof. In addition, in certain embodiments, a capacitor having the ferroelectric dielectric film 120 may be used as a capacitor constituting a unit cell of a ferroelectric memory device.

In certain embodiments and as also discussed above, the upper electrode 122 is made of one or more conductive materials such as noble metals and/or conductive compounds containing the noble metals. The noble metals include, for example, palladium (Pd), ruthenium (Ru), platinum (Pt), and iridium (Ir). An exemplary conductive compound containing a noble metal is, for example, iridium dioxide ($IrO_2$).

In the drawings and specification, there have been disclosed embodiments of the invention and, although specific terms are employed, they are used in a generic and descriptive sense only and not for purposes of limitation, the scope of the invention being set forth in the following claims. Thus, the foregoing is illustrative of the present invention and is not to be construed as limiting thereof. Although a few exemplary embodiments of this invention have been described, those skilled in the art will readily appreciate that modifications are possible in the exemplary embodiments without materially departing from the novel teachings and advantages of this invention. Accordingly, all such modifications are intended to be included within the scope of this invention as defined in the claims. In the claims, means-plus-function clauses, where used, are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method for fabricating a semiconductor device, comprising:

forming an oxidation barrier pattern and a capping layer pattern which are sequentially stacked on a semiconductor substrate;

encasing exposed surfaces of the capping layer pattern with a mold insulating layer so that the mold insulating layer extends a distance above the capping layer pattern and between adjacent capping layer patterns, the mold insulating layer material having an etch selectivity with respect to the capping layer pattern material;

planarizing the mold insulating layer until a top portion of the capping Layer pattern is exposed;

removing the capping layer pattern to form a lower electrode recess exposing substantially an entire top surface of the corresponding underlying oxidation barrier pattern; and forming a lower electrode about inner surfaces of the lower electrode recess, wherein the capping layer pattern is made of a material having an etch selectivity with respect to the oxidation barrier pattern material.

2. The method of claim 1, wherein before formation of the oxidation barrier pattern and the capping insulating layer pattern onto the semiconductor substrate, the method comprises:

disposing an interlayer dielectric and an etch-stop layer over the semiconductor substrate so that the interlayer dielectric is closer the semiconductor substrate; and positioning a buried contact plug so that the contact plug extends through the etch-stop layer and the interlayer dielectric film to be in electrical communication with a predetermined region of the semiconductor substrate, wherein a top surface of the buried contact plug is adapted to contact a predetermined region of a bottom side of the oxidation barrier pattern, and wherein the etch-stop layer is made of an insulating material having an etch selectivity with respect to the mold insulating layer material.

3. The method of claim 1, wherein the oxidation barrier pattern comprises conductive metal nitride.

4. The method of claim 1, wherein the capping layer pattern comprises silicon nitride.

5. The method of claim 1, wherein the mold insulating layer comprises silicon oxide.

6. The method of claim 1, wherein the formation of the lower electrode comprises:

conformably forming a lower electrode layer on an exposed portion of the stacked semiconductor substrate including the inner surfaces of the lower electrode recess;

forming a sacrificial insulating layer on the lower electrode layer to fill the lower electrode recess; and planarizing the sacrificial insulating layer and the lower electrode layer down to a top portion of the mold insulating layer to form a lower electrode in the lower electrode recess.

7. A method according to claim 6, wherein the lower electrode is formed into a substantially cylindrical shape with a closed bottom surface that resides on the oxidation barrier pattern.

8. The method of claim 1, wherein the lower electrode comprises at least one noble metal and/or conductive compound containing a noble metal.

9. The method of claim 8, after formation of the lower electrode, the method further comprises:

etching the molding insulating layer to be removed; and sequentially stacking a dielectric film and an upper electrode on an upper surface of the lower electrode.

10. The method of claim 9, wherein the dielectric film has a higher dielectric constant than oxide-nitride-oxide (ONO).

11. The method of claim 9, wherein the dielectric film comprises a ferroelectric substance.

12. The method of claim 9, wherein the upper electrode comprises a noble metal and/or a conductive compound containing a noble metal.

13. A method for fabricating a semiconductor device with a plurality of MIM capacitors in unit cells of an integrated circuit memory device, comprising:

forming an oxidation barrier pattern on a semiconductor substrate; and forming a lower electrode disposed on the oxidation barrier pattern so that a top surface area of the oxidation barrier pattern is substantially equal to a bottom surface area of the lower electrode, wherein the lower electrode forming step comprises:

forming a layer on the oxidation barrier pattern, the layer having a recess with a bottom that is sized to be substantially coextensive with a top surface of the oxidation barrier pattern; and applying a conductive layer in the recess to thereby form the lower electrode.

14. A method according to claim 13, further comprising:

forming a interlayer dielectric layer on the semiconductor substrate prior to forming the oxidation barrier pattern;

placing a contact plug in the interlayer dielectric layer so that it extends a distance through the interlayer dielectric layer to be in electrical communication with a predetermined region of the semiconductor substrate prior to forming the oxidation barrier pattern; and forming an etch stop layer over the interlayer dielectric layer prior to forming the oxidation barrier pattern.

15. A method according to claim 13, wherein the forming the lower electrode step comprises forming the lower electrode to have a generally cylindrical shape with a closed bottom surface, the closed bottom surface disposed on the oxidation barrier pattern.

16. A method according to claim 13, wherein the forming the lower electrode step comprises forming the lower electrode to have, in cross-section, two substantially parallel spaced apart upwardly extending sidewalls with an open upper portion and a closed bottom surface with the closed bottom surface residing on the oxidation barrier pattern.

17. A method for fabricating a semiconductor device with a plurality of MIM capacitors in unit cells of an integrated circuit memory device, comprising:

forming an oxidation barrier pattern on a semiconductor substrate; and forming a lower electrode disposed on the oxidation barrier pattern so that a top surface area of the oxidation barrier pattern is substantially equal to a bottom surface area of the lower electrode, wherein the forming the layer onto the oxidation barrier pattern is carried out by applying a capping layer over the oxidation barrier pattern after the step of forming the oxidation barrier pattern, forming a capping layer pattern by selectively removing portions of the capping layer, disposing a mold insulating layer over the capping layer pattern and then removing the capping layer pattern to form the recess.

* * * * *